United States Patent [19]

Nishihashi et al.

[11] Patent Number: 4,904,934
[45] Date of Patent: Feb. 27, 1990

[54] TESTING APPARATUS FOR SEMICONDUCTOR DEVICES

[75] Inventors: Ryouji Nishihashi; Kiyoji Imanaka; Katsuji Kawaguchi; Hidekazu Iwasaki, all of Itami, Japan

[73] Assignee: Mitsubishi Denki Kabushiki Kaisha, Japan

[21] Appl. No.: 259,779

[22] Filed: Oct. 19, 1988

[30] Foreign Application Priority Data

Oct. 21, 1987 [JP] Japan .................. 62-267187

[51] Int. Cl.[4] .............................. G01R 31/22
[52] U.S. Cl. .................. 324/158 F; 324/73.1
[58] Field of Search ........... 324/158 F, 158 P, 73 PC, 324/73 AT, 73 T, 73 R; 414/788.9, 924, 416; 209/573, 574; 364/579

[56] References Cited

U.S. PATENT DOCUMENTS

| | | | |
|---|---|---|---|
| 3,094,212 | 6/1963 | Moore et al. | 324/73 AT |
| 3,412,333 | 11/1968 | Frick et al. | 324/158 F |
| 4,103,232 | 7/1978 | Sugita et al. | 324/158 F |
| 4,593,820 | 6/1986 | Antonie et al. | 324/158 F |

Primary Examiner—Ernest F. Karlsen
Assistant Examiner—Vinh P. Nguyen
Attorney, Agent, or Firm—Leydig, Voit & Mayer

[57] ABSTRACT

A testing apparatus includes a turntable, a driving device for rotating the turntable by a predetermined angle, and a plurality of pallets symmetrically fixed on the turntable around a center of rotation of the turntable. Each pallet holds a plurality of semiconductor devices and has electrode patterns for connection to leads of the semiconductor devices. A tester for testing the semiconductor devices is electrically connected with the electrode patterns of one of the pallets located at a first position in the rotation of the turntable by a connecting device. An exchanging device exchanges the semiconductor devices for new ones on one of the pallets located at a second position in the rotation of the turntable. A cover covers the turntable except around the second position. A heating device heats the inside of the cover to maintain the semiconductor devices held on the pallets in the cover at a high temperature.

13 Claims, 4 Drawing Sheets

FIG. 8
PRIOR ART
FIG. 9
PRIOR ART
FIG. 10
PRIOR ART
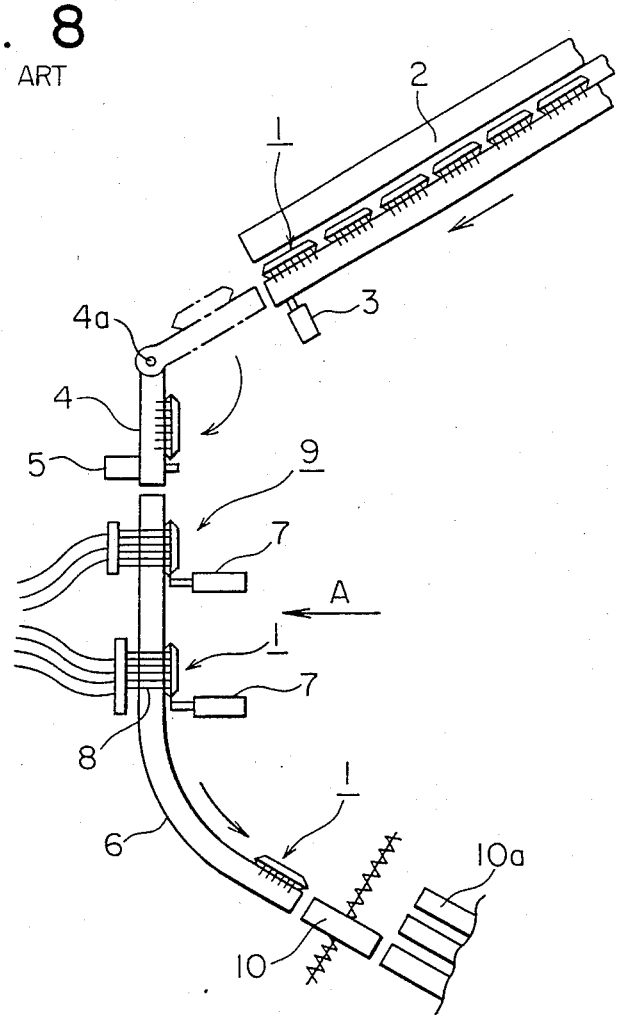
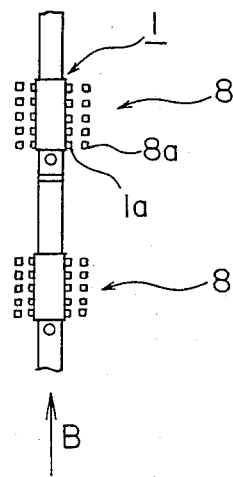
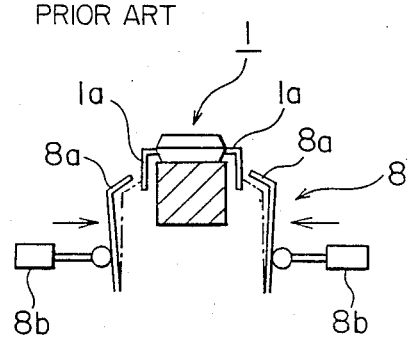

TESTING APPARATUS FOR SEMICONDUCTOR DEVICES

BACKGROUND OF THE INVENTION

1. Field of the Invention

The present invention relates to a testing apparatus for simultaneously testing the adaptability to high temperatures of a plurality of semiconductor devices.

2. Description of the Related Art

In general, semiconductor devices such as integrated circuits (hereinafter referred to as IC's) are subjected to various tests after they are produced by a manufacturing apparatus. One of the tests is to test their adaptability to high temperatures.

A conventional testing apparatus for performing this type of test has a structure as shown in FIG. 8. The apparatus includes a loader heat rail 2 which is sloped for receiving a plurality of IC's 1. The loader heat rail 2 has a heating device (not shown) for heating the IC's 1 and a shutter 3 provided at the inclined lower end thereof. A rotatable rail 4 is pivoted at one end 4a on a lower extension of the loader heat rail 2 and has a shutter 5 provided at the other end thereof. A curved guide rail 6 is disposed below the rotatable rail 4. A testing section 9, which comprises two shutters 7 and two contact mechanisms 8, is formed on the upper portion of the guide rail 6. As shown in FIGS. 9 and 10, each contact mechanism 8 has a plurality of contacts 8a and driving devices 8b for pivoting the contacts 8a into contact with electrode leads 1a of the IC 1 supported by the shutter 7. The contacts 8a are electrically connected to a tester (not shown).

As shown in FIG. 8, the guide rail 6 is curved at the lower portion thereof and a distributor 10 is disposed in front of the lower end of the guide rail 6 for distributing the IC's 1 to one of a plurality of dispensing pipes 10a.

The conventional testing apparatus having the construction described above operates in the following manner.

After a plurality of IC's 1 are supplied to the loader heat rail 2 and heated to a high temperature by the unillustrated heating device, a first one of the IC's 1 is sent out from the loader heat rail 2 to the rotatable rail 4, which is rotated to an upper position illustrated with dashed lines in FIG. 8, by temporarily opening the shutter 3 at the lower end of the loader heat rail 2 and the shutter 5 of the rotatable rail 4. The shutters 3 and 5 are then closed and the rotatable rail 4 carrying the first IC 1 is rotated to a lower position illustrated with a solid line in FIG. 8 in which the rotatable rail 4 is disposed substantially vertically. Thereafter, the shutter 5 is opened so that the first IC 1 received on the rotatable rail 4 falls to the testing section 9 and is supported by the closed lower shutter 7. By repeating the same operation, a second one of the IC's 1 is supplied to the testing section 9 and supported by the upper shutter 7.

In each contact mechanism 8, the contacts 8a are then connected to the leads 1a of the IC 1 by the driving devices 8b. In this state, testing of the IC's 1 set in the testing section 9 is conducted by the unillustrated tester connected to the contacts 8a.

After testing of the IC's 1 is completed, the contacts 8a of the lower contact mechanism 8 are separated from the leads 1a of the first IC 1 by the driving devices 8b and the lower shutter 7 is opened to send out the first IC 1 to the distributor 10. This first IC 1 can be classified into several classes according to the results of the test and is introduced into one of the dispensing pipes 10a corresponding to its respective class by the distributor 10 so that the first IC 1 is dispensed from this testing apparatus through the pipe 10a. The second IC 1 is then sent to the distributor 10 and classified and dispensed from this testing apparatus through a suitable pipe 10a.

Subsequently, by repeating the above described operation, the next two IC's 1 are tested and dispensed from the testing apparatus. The IC's 1 are subjected to the high temperature adaptability test two by two in this manner.

As described above, however, in the conventional testing apparatus, the following operations are conducted in series: separation of the contacts 8a from the leads 1a of the IC's 1, classifying and dispensing of the IC's 1, supply of the next IC's 1 to the testing section 9, and bringing the contacts 8a into contact with the leads 1a of these next IC's 1. Accordingly, there is a lot of wasted time in which the tester is not being operated, thereby reducing the testing capacity of the semiconductor device testing apparatus.

If the testing section 9 has three or more contact mechanisms 8 and shutters 7, a larger number of IC's 1 can be tested simultaneously. The waiting time of the tester, however, increases in proportion to the number of IC's 1 to be tested simultaneously. As a result, the rate of operation of the tester can not be improved.

SUMMARY OF THE INVENTION

In view of the above-described problems of the conventional art, an object of the present invention is to provide a testing apparatus which can simultaneously test a large number of semiconductor devices with high efficiency.

To this end, the present invention provides a testing apparatus including: a turntable and driving means for rotating the turntable incrementally through steps of a predetermined angle. A plurality of pallets are symmetrically fixed to the turntable around a center of rotation of the turntable, each pallet serving to hold a plurality of semiconductor devices and having electrode patterns to be connected to leads of the semiconductor devices. A tester for testing the semiconductor devices can be electrically connected to the electrode patterns of one of the pallets which is located at a first position in the rotation of the turntable by a connecting means. An exchanging means for exchanging the semiconductor devices for new ones on one of the pallets is located at a second position in the rotation of the turntable. A cover covers the turntable except around the second position. A heating means heats the inside of the cover to maintain the semiconductor devices held on the pallets in the cover at a high temperature.

BRIEF DESCRIPTION OF THE DRAWINGS

FIG. 8 is a schematic view of a conventional testing apparatus;

FIG. 9 is a side view of a portion of the conventional apparatus viewed in the direction of arrow A of FIG. 8; and FIG. 10 is a sectional view of a portion of the conventional apparatus from view point B of FIG. 9.

DESCRIPTION OF THE PREFERRED EMBODIMENTS

Referring now to the accompanying drawings, a description will be given of a few preferred embodiments of the present invention.

Figure 1:
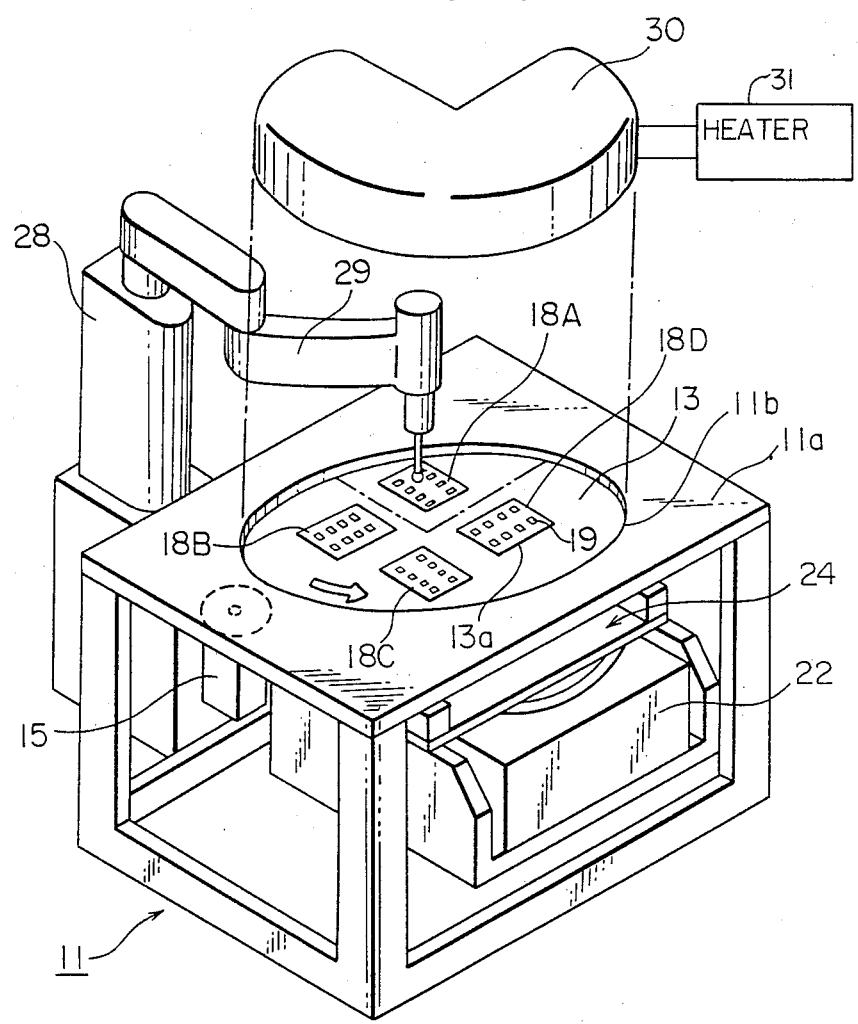
FIG. 1 is an exploded perspective view of a testing apparatus in accordance with a first embodiment of the invention.

FIGS. 1 through 5 show a first embodiment of a testing apparatus in accordance with the present invention. In FIG. 1, an upper board 11a having a circular opening 11b is mounted on the top of a box-shaped frame 11. A disk-like turntable 13 is provided below the opening 11b and is rotated in a plane parallel to the upper board 11a by a motor 15 disposed in the frame 11. Four rectangular openings 13a are symmetrically formed in the turntable 13 around a center of rotation of the turntable 13 and four pallets 18A~18D for holding IC's 19 are fixed in the corresponding openings 13a. Also disposed on the bottom of the frame 11 is a tester 22 for testing semiconductor devices set on the pallets 18A~18D. A connecting mechanism 24 for electrically connecting the tester 22 with the IC's 19 held on one of the pallets is located just above the tester 22 (pallet 18D, for example, in FIGS. 1 and 4). Three-quarters of the circular opening 11b in the upper board 11a is covered with a generally cylindrical cover 30 which has a circular cross section with a quarter thereof cut away. An exchanging mechanism 28 such as a robot is provided at the side of the frame 11 and has a movable arm 29 located above the uncovered quarter of the opening 11b. A heating device 31 such as a hot air supply device is connected to the inside of the cover 30.

Figure 2:
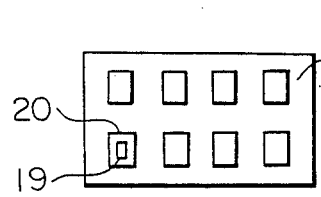
FIGS. 2 and 3 are a plan view and a side view, respectively, of a pallet used in the apparatus of FIG. 1.
Figure 3:
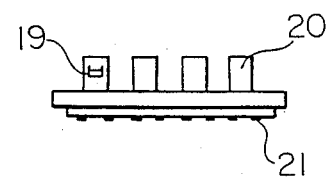

Each of the pallets 18A~18D has eight sockets 20 on the upper surface thereof. Each socket 20 holds one of the IC's 19, as shown in FIG. 2. Each pallet is provided on the lower surface thereof with electrode patterns 21 connected to leads of the IC's 19 held in the sockets 20, as shown in FIG. 3. The pallets 18A~18D may be formed from printed circuit boards, and in this case, conductive patterns such as copper foil patterns of the printed circuit boards serve to connect the leads of the IC's 19 with the electrode patterns 21.

Figure 4:
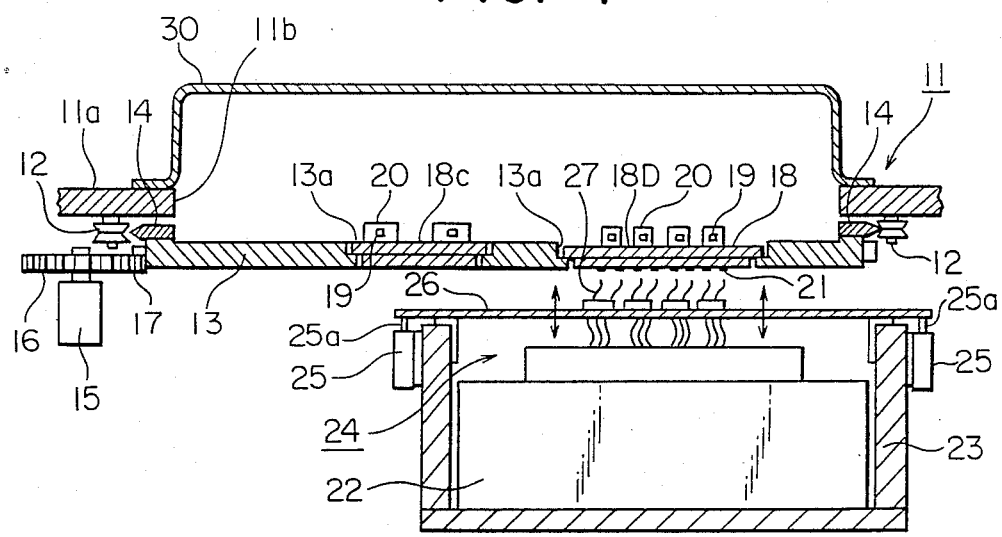
FIG. 4 is a cross-sectional view of a portion of the apparatus of FIG. 1.

As shown in FIG. 4, a plurality of rollers 12 are rotatably mounted on the lower surface of the upper board 11a around the opening 11b and along a circle concentric with the turntable 13. An annular guide member 14 is fixed to the periphery of the turntable 13 and engaged with the rollers 12 for rotatably supporting the turntable 13 below the opening 11b in the upper board 11a. Gear teeth 17 are formed along the peripheral edge of the turntable 13 and are engaged with a pinion 16 fixed on a shaft of the motor 15. The motor 15 is intermittently operated by a driving circuit (not shown) so as to rotate the turntable 13 by a quarter of one revolution. That is, the pallets 18A~18D, which are symmetrically disposed around the center of rotation of the turntable 13 as shown in FIG. 5, are rotated by 90° at a time and then stopped.

Figure 5:
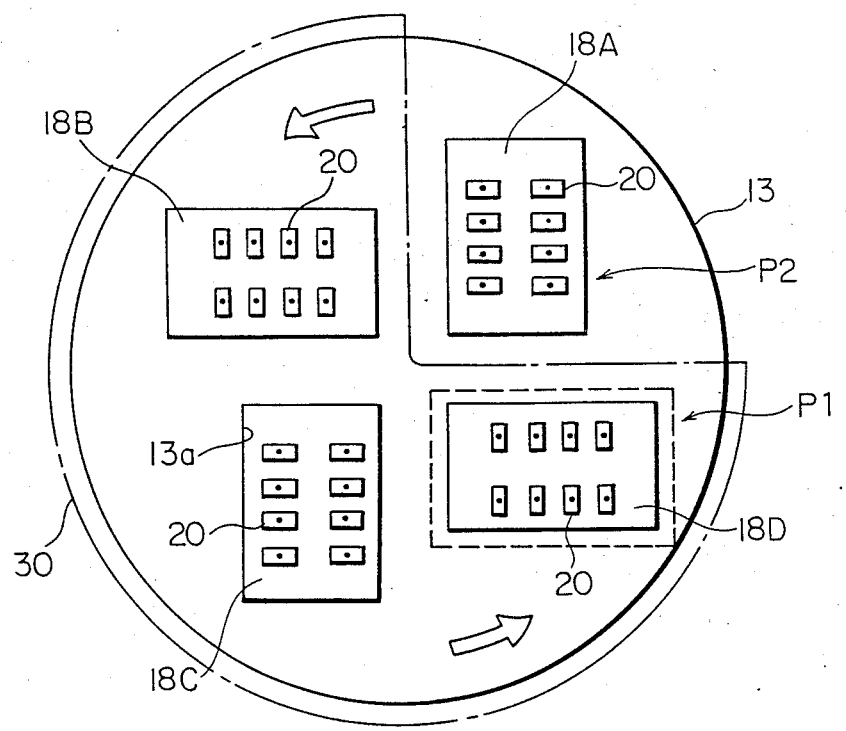
FIG. 5 is a plan view of a turntable used in the apparatus of FIG. 1.

In FIG. 5, the position of pallet 18D will be referred to as a first position P1, and the position of pallet 18A will be referred to as a second position P2. If the turntable 13 is rotated counterclockwise, the pallets 18C and 18D will then be located at the first and second positions P1 and P2, respectively. The second position P2 is not covered with the cover 30.

The connecting mechanism 24 and the tester 22 are located just below the first position P1 as shown in FIG. 4. The connecting mechanism 24 has a box-shaped frame 23 and a plurality of cylinders 25 secured to the outer surface of the wall of the frame 23. A contact supporting board 26 is fixedly mounted on and supported by piston rods 25a of the cylinders 25 so that the board 26 can be moved up and down relative to the frame 23 by the operation of the cylinders 25. A plurality of contacts 27 are provided on the upper surface of the board 26 at locations corresponding to the electrode patterns 21 of the pallet which is located at the first position P1. The contacts 27 are electrically connected to the tester 22 disposed in the frame 23. The leads of the IC's 19 held in the sockets 20 of the pallet in the first position P1 are connected with the tester 22 via the electrode patterns 21 of the pallet and the contacts 27 when the board 26 is raised by the cylinders 25, and are separated from the tester 22 when the board 26 is lowered by the cylinders 25.

The operation of this embodiment is as follows. First, the motor 15 is intermittently operated by the unillustrated driving circuit so that the turntable 13 is rotated in a stepwise manner by a quarter of one revolution. That is, the four pallets 18A~18D are temporarily stopped in succession at the second position P2. IC's 19 are then supplied to the sockets 20 of the pallet, which is located at the second position P2, by the arm 29 of the exchanging mechanism 28. By repeating the intermittent rotation of the turntable 13 and the supplying of the IC's 19 to the pallet at the second position P2, all of the pallets 18A~18D are supplied with IC's 19. At the same time, hot air is supplied into the cover 30 by the heating device 31 so that the inside of the cover 30 is maintained at a predetermined high temperature. Accordingly, the IC's 19, which are held on the pallet located in the cover 30, are also maintained at a high temperature. Particularly, since the turntable 13 is rotated counterclockwise in FIG. 5, the IC's 19 held on the pallet 18D at the first position P1 have already been heated for a sufficiently long time.

The contact supporting board 26 is then raised by the cylinders 25 so that the contacts 27 are connected to the electrode patterns 21 of the pallet 18D which is located at the first position P1 as shown in FIGS. 4 and 5. The leads of the IC's 19 held on the pallet 18D are thereby connected with the tester 22 via the electrode patterns 21 of the pallet 18D and the contacts 27. In this state, the IC's 19 held on the pallet 18D are tested by the tester 22. At this time, the IC's 19 held on the pallets 18B, 18C and 18D have been heated to the predetermined high temperature in the cover 30.

After testing of the IC's 19 held on pallet 18D is completed, the contact supporting board 26 is lowered by the cylinders 25 to separate the contacts 27 from the electrode patterns 21 of pallet 18D. Subsequently, the turntable 13 is rotated counterclockwise a quarter of one revolution by the motor 15, whereby pallet 18D is now located at the second position P2 while pallet 18C is located at the first position P1.

Those IC's 19 which have already been subjected to the test are then removed from pallet 18D located at the second position P2 by the arm 29 of the exchanging mechanism 28 and a set of new IC's 19 is supplied to pallet 18D by the arm 29. At the same time, the contacts 27 are connected to the electrode patterns 21 of pallet 18C by the connecting mechanism 24 and the IC's 19 held on pallet 18C are tested by the tester 22 in the same manner as the IC's 19 held on pallet 18D.

By repeating the exchange of the tested IC's 19 for new ones and the intermittent rotation of the turntable 13 as described above, the testing of the IC's 19 can be conducted continuously. The rate of operation of the tester 22 is increased so that a large number of IC's can be tested with high efficiency.

Although in the embodiment as described, the contacts 27 are connected to the electrode patterns 21 of a pallet by being raised with the contact supporting board 26, the pallet located at the first position P1 may be lowered so as to contact the electrode patterns 21 thereof with fixed contacts 27 of the connecting mechanism 24. In this case, a driving device for moving the pallet or the whole turntable 13 up and down is required instead of the cylinders 25 for moving the contacts 27 along with the contact supporting board 26.

Figure 6:
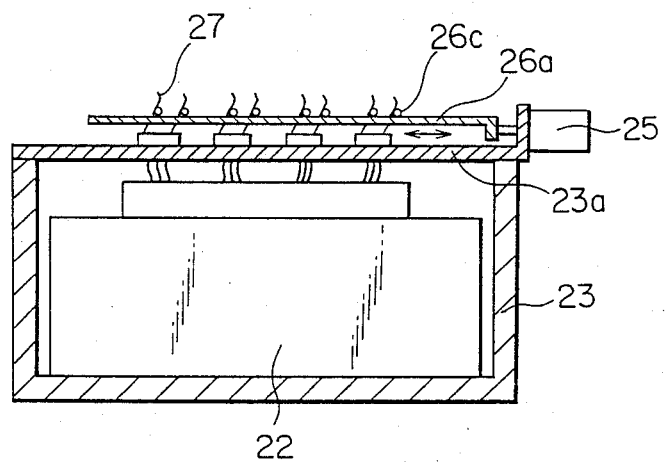
FIGS. 6 and 7 are a fragmentary sectional view and a fragmentary perspective view, respectively, of a second embodiment of the invention.
Figure 7:
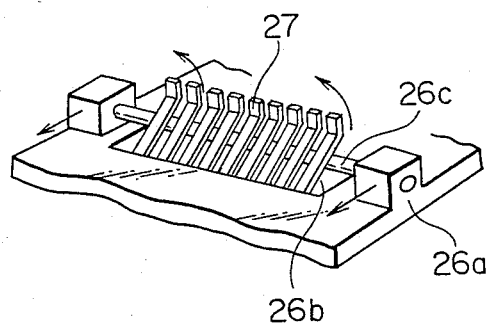

FIG. 6 shows another example of the connecting mechanism 24. This mechanism 24 has a fixed board 23a secured to the frame 23 and a sliding board 26a which is moved parallel to the upper surface of the fixed board 23a and to the right and left in FIG. 6 by means of a cylinder 25 mounted at one end of the fixed board 23a. The upper surface of the fixed board 23a is provided with a plurality of elastic contacts 27 inclined in the same direction (e.g., to the right in FIG. 6). The sliding board 26a has a plurality of rectangular openings 26b which are disposed in a spaced parallel relation with each other along the sliding direction of the sliding board 26a and the contacts 27 pass therethrough as shown in FIG. 7. A pressing rod 26c is provided across each opening 26b for supporting the upper portions of the inclined contacts 27. The contacts 27 are connected to the tester 22 disposed in the frame 23.

In operation, when the sliding board 26a is slid to the right by the cylinder 25 in FIG. 6, the contacts 27 incline under their own elasticity to the right at a large angle with respect to the vertical to separate from the electrode patterns 21 of the pallet located above this connecting mechanism 24. However, when the sliding board 26a is moved to the left in FIG. 6 by the cylinder 25, the contacts 27 are pressed to the left by the pressing rods 26c fixed to the sliding board 26a so that the contacts 27 are elastically raised to contact the electrode patterns 21 of the pallet.

The contacts 27 may be mounted rotatably in a vertical plane on the fixed board 23a using pivots or the like.

In the embodiments described above, four pallets 18A~18D are arranged on the turntable 13 and each pallet has eight sockets 20 for holding the IC's 19. However, any number of pallets may be employed if the number is more than two. In this case, it is necessary to adjust the intermittent rotation angle of the turntable 13 to correspond to the number of pallets. Furthermore, any number of sockets 20 may be provided on each pallet.

What is claimed is:

1. A testing apparatus comprising:
   a plurality of pallets, each of said pallets having a plurality of electrode patterns and a plurality of supports, each of which supports a semiconductor device and electrically connects the semiconductor device to one of said electrode patterns;
   pallet moving means for moving said pallets along a path having a plurality of positions, the positions including a testing position and an exchanging position;
   a tester for testing the semiconductor devices;
   a plurality of contacts electrically connected to said tester;
   connecting means for electrically connecting said contacts to said electrode patterns for electrically connecting a plurality of the semiconductor devices on a pallet at the testing position to the tester at the same time;
   heating means for heating the semiconductor devices to a prescribed testing temperature; and
   exchanging means for exchanging the semiconductor devices on the pallet at the exchanging position with other semiconductor devices.

2. A testing apparatus as claimed in claim 1 wherein said connecting means comprises means for moving said support towards the pallet at the testing position.

3. A testing apparatus as claimed in claim 1 wherein said connecting means comprises means for moving the pallet moving means towards said support.

4. A testing apparatus as claimed in claim 1 wherein said connecting means comprises:
   a support on which said contacts are mounted; and
   deflecting means for deflecting said contacts from a first position in which said contacts are not electrically connected to said electrode patterns of the pallet at the testing position and a second position in which said contacts are electrically connected to said electrode patterns of the pallet at the testing position.

5. A testing apparatus as claimed in claim 4 wherein:
   said support comprises a first plate; and
   said deflecting means comprises a second plate which is generally parallel to said first plate, a through hole formed in said second plate through which said contacts extend, means for moving said second plate parallel to said first plate, and means for exerting a force on said contacts to cause said contacts to deflect towards said electrode patterns when said second plate is moved.

6. A testing apparatus as claimed in claim 4 wherein said contacts are made of an elastically bendable material and are elastically biased towards one of said first and second positions.

7. A testing apparatus as claimed in claim 1 wherein said pallet moving means comprises a turntable and means for incrementally rotating said turntable.

8. A testing apparatus as claimed in claim 7 wherein said turntable includes a plurality of through holes and each of said pallets is mounted in one of the through holes.

9. A testing apparatus as claimed in claim 1 further comprising a cover including an opening in a position corresponding to the exchanging position.

10. A testing apparatus as claimed in claim 9 wherein said exchanging means comprises means for accessing the pallet at the exchanging position through the opening in said cover.

11. A testing apparatus as claimed in claim 1 wherein said heating means comprises means for supplying hot air within said cover.

12. A testing apparatus as claimed in claim 1 wherein each of said pallets has a first surface having a plurality of sockets for holding semiconductor devices and a second surface on which said electrode patterns are formed, each semiconductor device being electrically connected to one of said electrode patterns when mounted in one of said sockets.

13. A testing apparatus as claimed in claim 12 wherein the second surface of each pallet comprises a printed circuit board, said electrode patterns being formed on said printed circuit board.

* * * * *